United States Patent
Blankenship et al.

(10) Patent No.: US 7,467,366 B2
(45) Date of Patent: Dec. 16, 2008

(54) METHOD FOR GENERATING A TIMING PATH SOFTWARE MONITOR FOR IDENTIFYING A CRITICAL TIMING PATH IN HARDWARE DEVICES COUPLED BETWEEN COMPONENTS

(75) Inventors: John B. Blankenship, Raleigh, NC (US); Kevin N. Magill, Raleigh, NC (US); Jeffrey R. Summers, Raleigh, NC (US); Anup Wadia, Wake Forest, NC (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 11/535,203

(22) Filed: Sep. 26, 2006

(65) Prior Publication Data

US 2008/0077895 A1 Mar. 27, 2008

(51) Int. Cl.
*G06F 9/45* (2006.01)
*G06F 17/50* (2006.01)
(52) U.S. Cl. ............... 716/6; 716/4; 716/5; 703/19
(58) Field of Classification Search .......... 716/4–6; 714/724; 703/14, 19
See application file for complete search history.

(56) References Cited

U.S. PATENT DOCUMENTS

| | | | |
|---|---|---|---|
| 5,872,717 A | 2/1999 | Yu et al. | |
| 6,131,080 A | 10/2000 | Raimi et al. | |
| 6,181,320 B1 | 1/2001 | Fredrickson | |
| 6,313,622 B1 | 11/2001 | Seki et al. | |
| 6,414,527 B1 | 7/2002 | Seno et al. | |
| 6,553,549 B1 | 4/2003 | Gowni et al. | |
| 6,604,227 B1 | 8/2003 | Foltin et al. | |
| 6,654,938 B2 | 11/2003 | Kosugi | |
| 6,745,376 B2 * | 6/2004 | Fredrickson | 716/6 |
| 6,847,252 B1 | 1/2005 | Ono et al. | |

(Continued)

FOREIGN PATENT DOCUMENTS

JP 2003167939 A 6/2003

OTHER PUBLICATIONS

Chan et al., Algorithm to Calculate Data Used by Logic Synthesis of Timing Critical Designs, IBM Technical Disclosure Bulletin, Oct. 1992, pp. 409-411, vol. 35, No. 5.

*Primary Examiner*—Paul Dinh
*Assistant Examiner*—Nha T Nguyen
(74) *Attorney, Agent, or Firm*—Cantor Colburn LLP; Josh Cockburn (57) ABSTRACT

A method for generating a timing path software monitor for identifying a critical timing path in hardware devices coupled between first and second components is provided. The method includes generating a static timing report associated with the hardware devices. The static timing report has names of the hardware devices and wire names associated with wires coupled to the hardware devices. The method further includes automatically generating the timing path software monitor based on the static timing report that monitors binary values associated with the wire names at a first clock cycle and a transition of binary values associated with the wire names during a second clock cycle after the first clock cycle. The timing path software monitor indicates a critical timing path is identified when the transition of one of the binary values received by the second component occurs during the second clock cycle.

1 Claim, 7 Drawing Sheets

U.S. PATENT DOCUMENTS

| | | |
|---|---|---|
| 6,920,625 B2 | 7/2005 | Gass |
| 7,231,565 B2 * | 6/2007 | Lin .............................. 714/724 |
| 7,315,802 B1 * | 1/2008 | Jenkins, IV .................. 703/14 |
| 2007/0011543 A1 * | 1/2007 | Yoshimura et al. .......... 714/738 |
| 2007/0016833 A1 * | 1/2007 | Lin .............................. 714/724 |

* cited by examiner

STATIC TIMING REPORT

| | | |
|---|---|---|
| func_reg0/Q | R | wireA |
| func_inv/A | R | wireA |
| func_inv/Z | F | wireB |
| func_buf/A | F | wireB |
| func_buf/Z | F | wireC |
| func_and/A | F | wireC |
| func_and/Z | F | wireD |
| func_reg1/D | F | wireD |

FIG. 4

TIMING PATH SOFTWARE MONITOR

```
int pre_condition_match=0;
while(cycle) {
    if (pre_condition_match==1 && (wireA & !wireB & !wireC & !wireD) ) {
        print ("Timing Path Hit");
    }
    if (!wireA & wireB & wireC & wireD) {
        pre_condition_match=1;
    }
    else {
        pre_condition_match=0;
    }
}
```

METHOD FOR GENERATING A TIMING PATH SOFTWARE MONITOR FOR IDENTIFYING A CRITICAL TIMING PATH IN HARDWARE DEVICES COUPLED BETWEEN COMPONENTS

FIELD OF INVENTION

This application relates to a method for generating a timing path software monitor for identifying a critical timing path in hardware devices coupled between components.

BACKGROUND OF INVENTION

Logic designers manually generate test code that exercise critical timing paths of the electronic hardware, for speed characterization of the electronic hardware. The test code is generally handwritten based on a gate-level static timing report associated with the electronic hardware. The logic designer attempts to pick instructions, and, if necessary, operands that they believe will exercise the portions of the electronic hardware with critical timing paths. Thereafter, the test code is executed on a hardware simulation tool to verify the timing path was exercised. This trial-by-error method requires numerous iterations to identify a single critical timing path, and requires extensive visual inspection to determine if the critical timing path is exercised.

Accordingly, the inventors herein have recognized a need for automatically generating timing path software monitors that can identify test cases that exercise critical timing paths of electronic hardware.

SUMMARY OF INVENTION

A method for generating a timing path software monitor for identifying a critical timing path in hardware devices coupled between first and second components in accordance with an exemplary embodiment is provided. The method includes generating a static timing report associated with the hardware devices. The static timing report has names of the hardware devices and wire names associated with wires coupled to the hardware devices. The method further includes automatically generating the timing path software monitor based on the static timing report that monitors binary values associated with the wire names at a first clock cycle and a transition of binary values associated with the wire names during a second clock cycle after the first clock cycle. The timing path software monitor indicates a critical timing path is identified when the transition of one of the binary values received by the second component occurs during the second clock cycle.

DESCRIPTION OF AN EMBODIMENT

Figure 1:
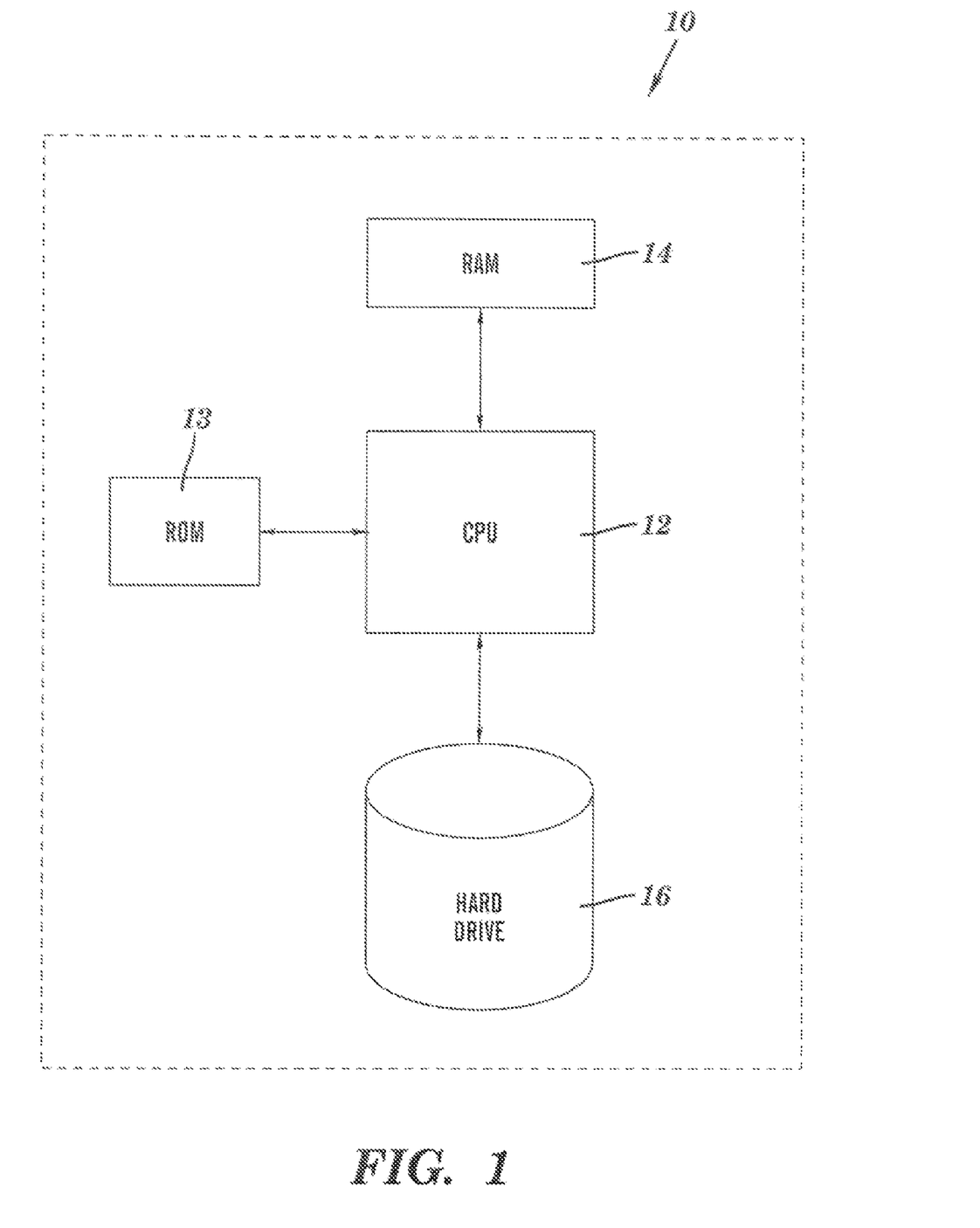
FIG. 1 is a block diagram of a system for generating a timing path software monitor for identifying a critical timing path in hardware devices coupled between first and second components.

Referring to FIG. 1 a computer 10 for generating a timing path software monitor for identifying a critical timing path in hardware devices coupled between first and second components is illustrated. For purposes of understanding, a component is defined as a register, a primary input device, or a primary output device. A critical timing path is defined as a logical path associated with hardware devices between a pair of components, that has a latency that is relatively close to a maximum desired latency. A timing path software monitor is a function that monitors a transition or non-transition of binary values output by the hardware devices in a timing path. Further, a test case is defined as a random or a deterministic grouping of binary input values. In particular, a test case provides a number of binary input values less than or equal to a number of desired input signals to stimulate hardware devices.

The computer 10 includes a central processing unit (CPU) 12, a read-only memory (ROM) 13, a volatile memory such as a random access memory (RAM) 14, and a hard drive 16. The CPU 12 operably communicates with the ROM 13, the RAM 14, and the hard-drive 16. The computer readable media including ROM 13 and RAM 14 may be implemented using any of a number of known memory devices such as PROMs, EPROMs, EEPROMS, flash memory or any other electric, magnetic, optical or combination memory device capable of storing data, some of which represent executable instructions used by the CPU 12.

Figure 2:
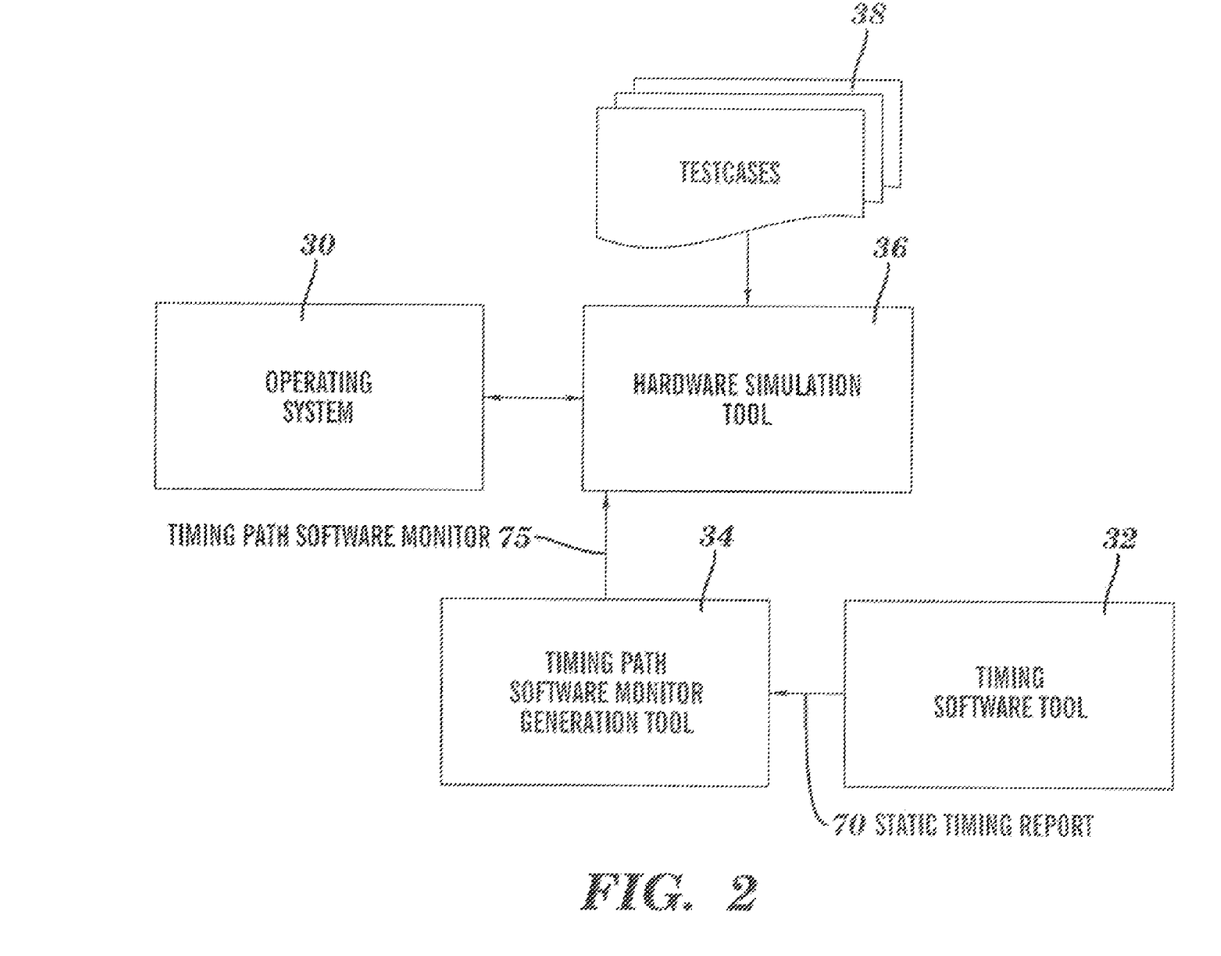
FIG. 2 is a block diagram of software applications utilized by the system of FIG. 1 to generate the timing path software monitor.

Referring to FIG. 2, a block diagram of the software modules executed or accessed by the CPU 12 is illustrated. In particular, the CPU 12 executes an operating system 30, a timing software tool 32, a timing path software monitor generation tool 34, a hardware simulation tool 36. Further, the CPU 12 accesses test cases 38 that are stored in the hard drive 16.

Figure 3:
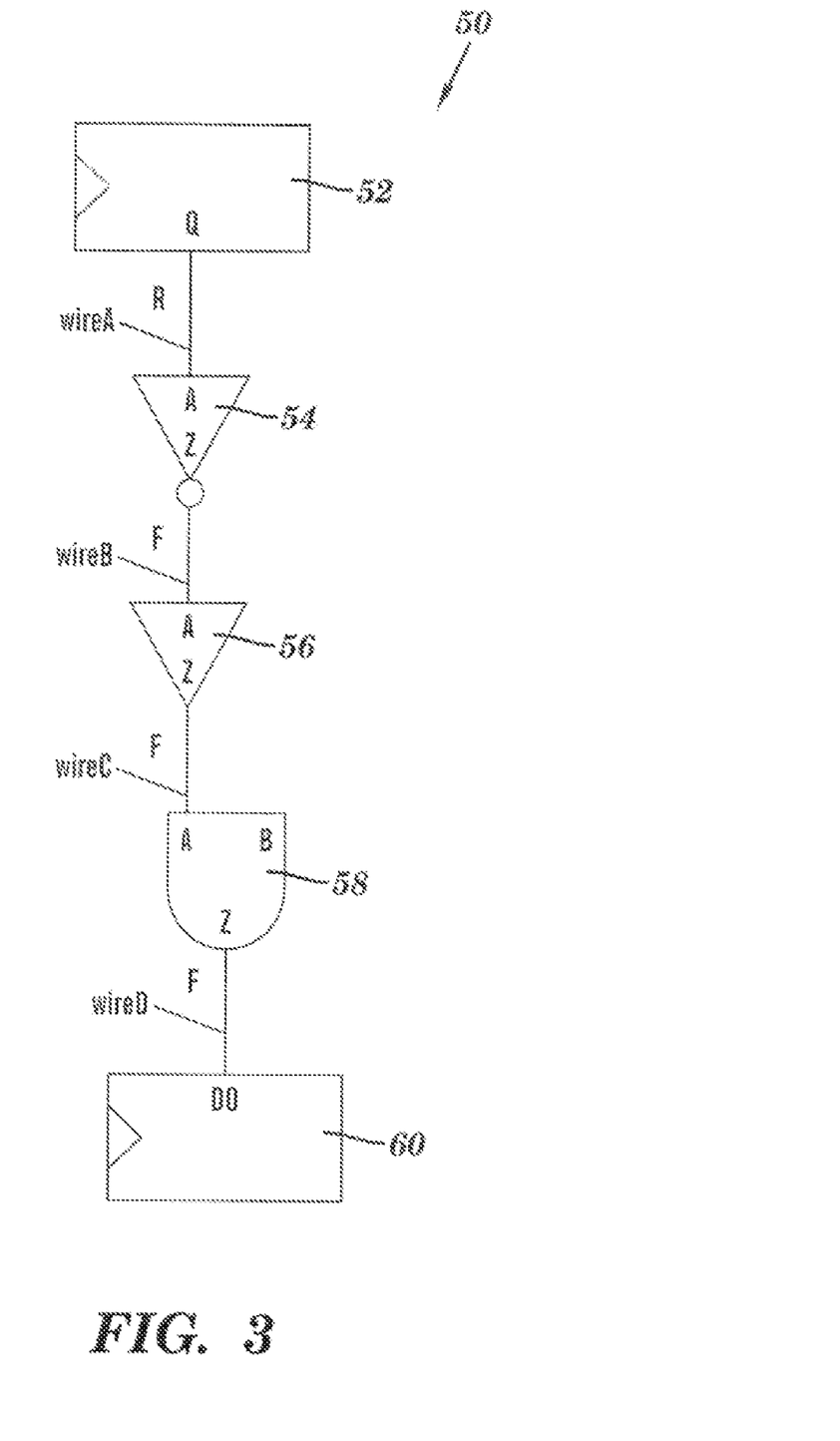
FIG. 3 is a schematic of an exemplary circuit having hardware devices coupled between first and second registers.
Figure 4:
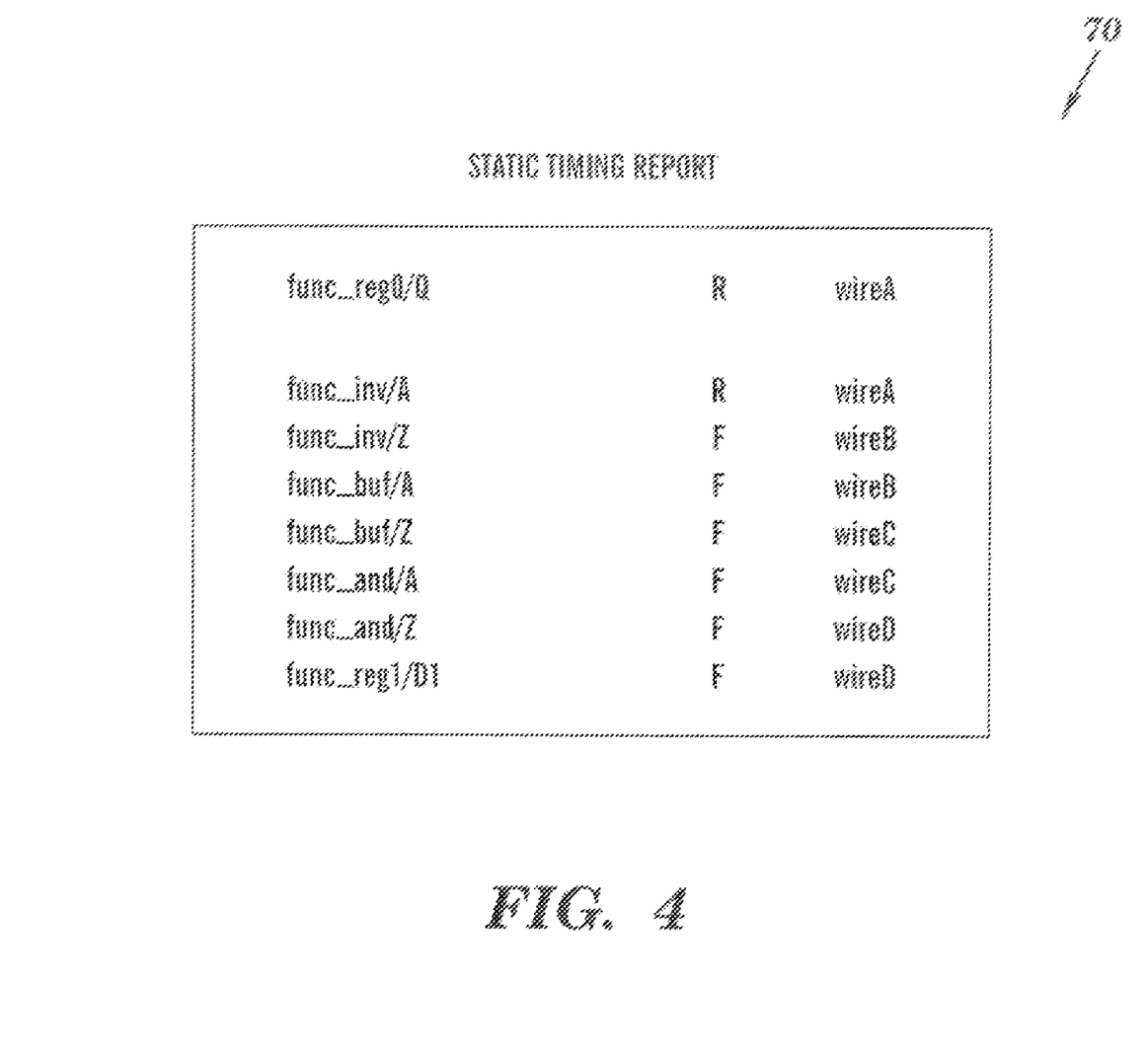
FIG. 4 is a schematic of an exemplary static timing report for the circuit of FIG. 3.

Referring to FIGS. 2-4, the timing software tool 32 is provided to generate a static timing report 70 indicative of a functional logical timing path associated with hardware devices between a pair of components. For example, in one exemplary embodiment, the timing software tool 32 can generate a static timing report 70 associated with a circuit 50. The circuit 50 has a register 52, an inverter 54, a buffer 56, a logical AND gate 58, and a register 60. In this exemplary embodiment, the pair of components are the register 52 and the register 60. As shown, the following text in the static timing report 70 corresponds to the associated hardware devices:

"func_inv/A" corresponds to an input of the inverter 54;
"func_inv/Z" corresponds to an output of the inverter 54;
"wireA" corresponds to an output wire between the register 52 and the inverter 54;
"func_buf/A" corresponds to an input of the buffer 56;
"func_buf/Z" corresponds to an output of the buffer 56;

"wireB" corresponds to a wire between the inverter 54 and the buffer 56;

"func_and/A" corresponds to an input of the logical AND gate 58;

"func_and/Z" corresponds to an output of the logical AND gate 58;

"wireC" corresponds to a wire between the buffer 56 and the logical AND gate 58;

"wireD" corresponds to a wire between the logical AND gate 58 and the register 60;

"R" corresponds to a rising binary value from a first clock cycle to a second clock cycle;

"F" corresponds to a falling binary value from the first clock cycle to the second clock cycle.

Figure 5:
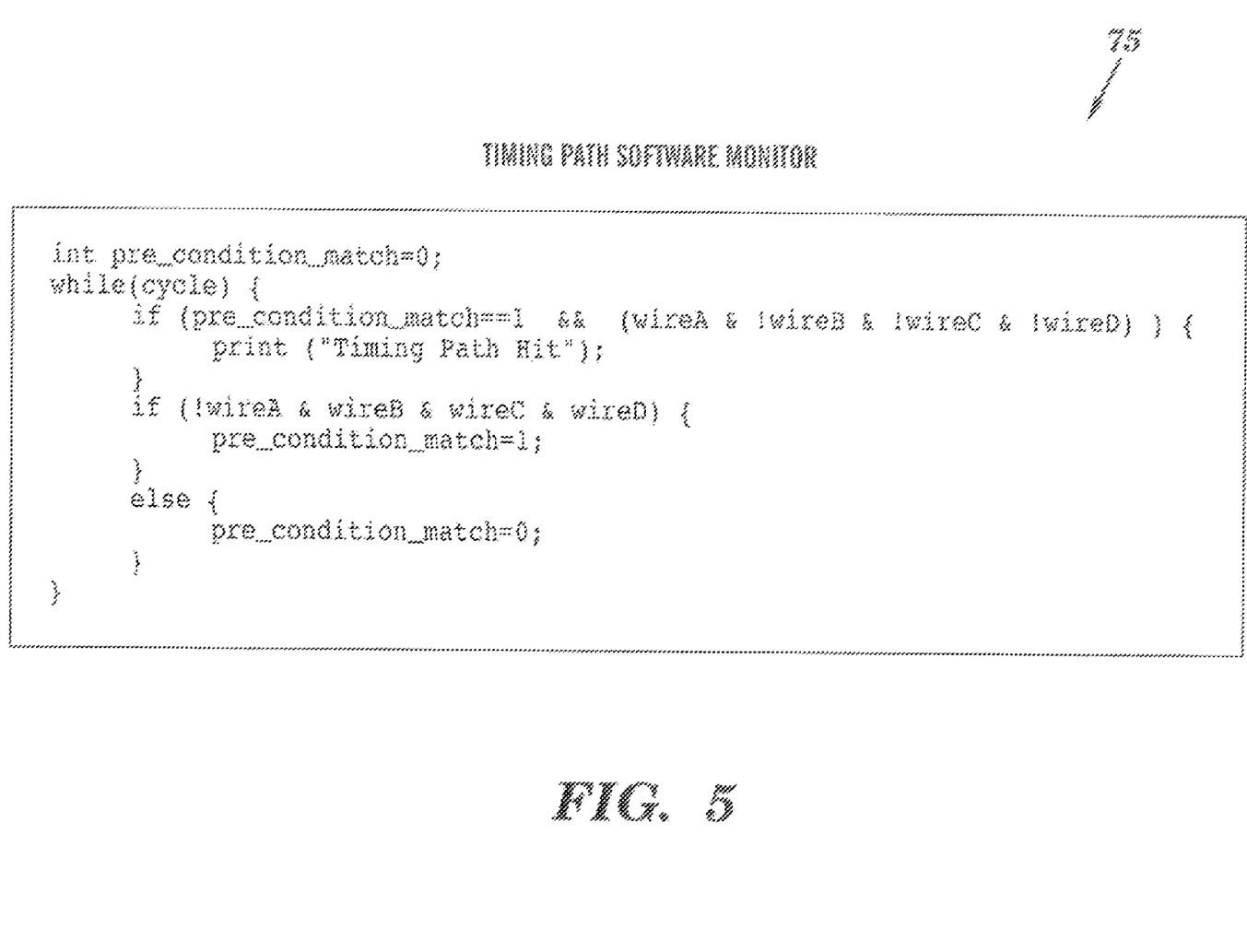
FIG. 5 is a schematic of an exemplary timing path software monitor for the circuit of FIG. 3.
Figure 6:
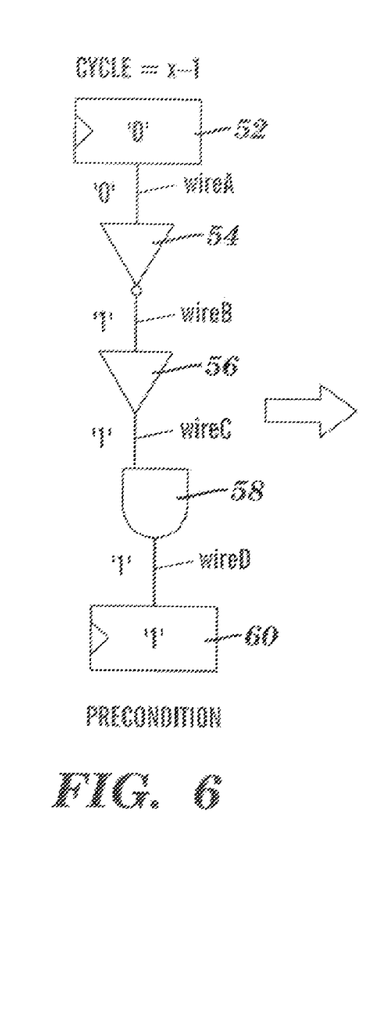
FIG. 6 is a schematic indicating binary values output by the circuit of FIG. 3 during a first clock cycle.
Figure 7:
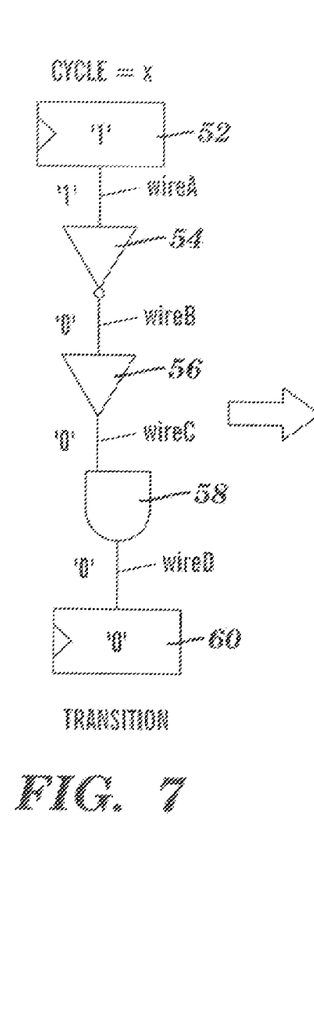
FIG. 7 is a schematic indicating binary values output by the circuit of FIG. 3 during a second clock cycle.

Referring to FIGS. 5-7, the timing path software monitor generation tool 34 is provided to generate timing path software monitors that are used by the hardware simulation tool 36 to identify test cases 38 that exercise critical timing paths, based on a static timing report 70. For example, the tool 34 can generate a timing path software monitor 75 based on the static timing report 70. First, the hardware simulation tool 36 utilizes the timing path software monitor 75 to determine whether an initial condition (or pre-condition) occurs in which binary values output by the hardware elements of the circuit 50 match a first set of predetermined binary values. For examples, the pre-condition occurs when wireA=0, wireB=1, wireC=1, and WireD=1 as shown in FIG. 6. Second, the hardware simulation tool 36 utilizes the software timing monitor 75 to determine when a transition of binary values from the hardware elements of circuit 50 occur such that binary values output by the hardware elements match a second set of predetermined binary values. For example, the desired transition occurs whenA=1, wireB=0, wireC=0, and wireD=0 as shown in FIG. 7. When the desired transition occurs, the timing path software monitor 75 indicates that a critical timing path was executed or hit.

Test cases 38 comprise a random or a deterministic grouping of binary input values that are stored in a memory. The test cases 38 are utilized to stimulate hardware devices in a functional model of an electronic circuit, such as a functional model of the circuit 50 for example.

Figure 8:
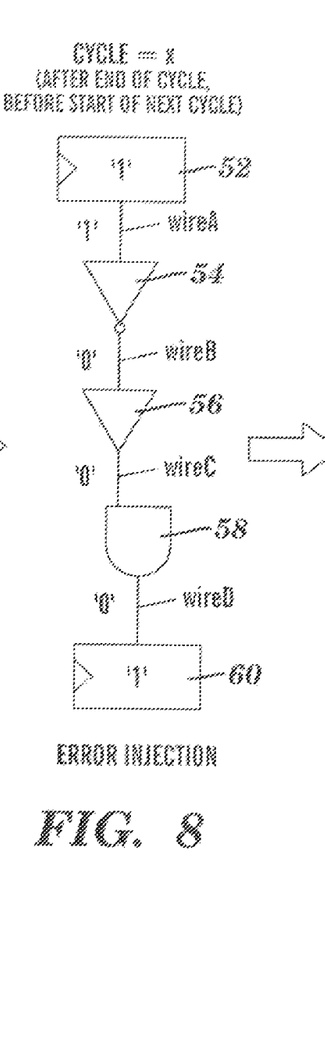
FIG. 8 is a schematic indicating binary values output by the circuit of FIG. 3 during a first clock cycle of error injection.
Figure 9:
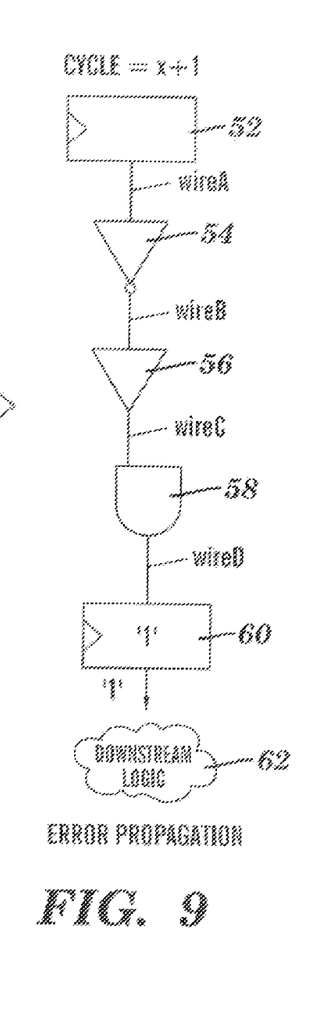
FIG. 9 is a schematic indicating binary values output by the circuit of FIG. 3 after the error injection of FIG. 8.

Referring to FIG. 2, the hardware simulation tool 36 is provided to simulate operation of the circuit 50 utilizing the functional model of the circuit 50. Of course, the hardware simulation tool 36 could utilize functional models of other circuits other than the functional model of circuit 50. During operation, the hardware simulation tool 36 operably communicates with the operating system 30, the test cases 38, and the timing path software monitor generation tool 34. Further, the hardware simulation tool 36 is configured to input one or more error injection values into the simulation of the functional model of the circuit 50. The error injection values are utilized to simulate a timing error on the register 60 of the circuit 50 when the timing path software monitor 75 indicates the critical timing path for circuit 50 has been exercised. In particular, an error injection value is utilized to determine whether an observable failure occurs in simulated downstream logic 62 from the circuit 50, as a result of the error injection value being input in the circuit 50. For example, referring to FIG. 8, the hardware simulation tool 36 can input a binary value of "1" into the simulated register 60 during a first clock cycle when the binary value should be equal to "0". Referring to FIG. 9, after the first clock cycle, the hardware simulation tool 36 propagates the binary value of "1" in the simulated register 60 to simulated downstream logic 62 whose output is observable by the hardware simulation tool 36. It should be noted that when a test case having the binary "1" is input into the timing path and subsequently results in a simulated failure in the downstream logic 62, the associated test case is stored in the hard drive 16.

The operating system 30 is provided to assist in executing commands generated by the hardware simulation tool 36, the critical path software monitor generation tool 34, and the timing software tool 32.

Figure 10:
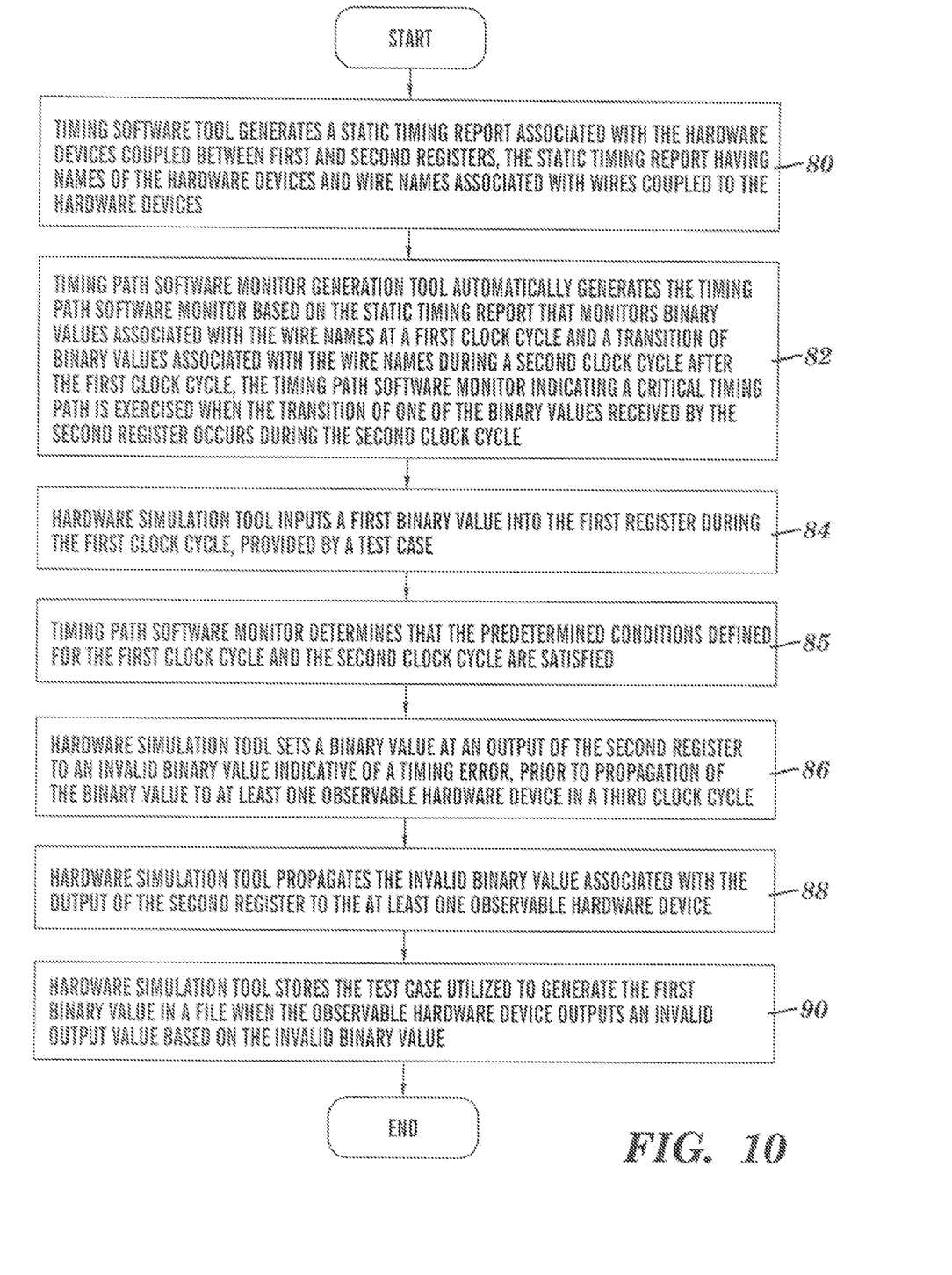
FIG. 10 is a flowchart of a method for generating a timing path software monitor for identifying a critical timing path in hardware devices coupled between first and second components.

Referring to FIG. 10, a method for generating a timing path software monitor for identifying a critical timing path in hardware devices coupled between a pair of components will now be explained. In the exemplary method, the pair of components comprise a pair of registers.

At step 80, the timing software tool 32 generates a static timing report 70 associated with the hardware devices coupled between registers 52, 60. The static timing report 70 has names of the hardware devices and wire names associated with wires coupled to the hardware devices.

At step 82, the timing path software monitor generation tool 34 automatically generates the timing path software monitor 75 based on the static timing report 70 that monitors binary values associated with the wire names at a first clock cycle and a transition of binary values associated with the wire names during a second clock cycle after the first clock cycle. The timing path software monitor 75 indicates a critical timing path is exercised when the transition of one of the binary values received by the second register occurs during the second clock cycle.

At step 84, the hardware simulation tool 36 inputs a first binary value into the register 52 during the first clock cycle, provided by a test case.

At step 85, the timing path software monitor 75 determines that the predetermined conditions defined for the first clock cycle and the second clock cycle are satisfied.

At step 86, the hardware simulation tool 36 sets a binary value at an output of the register 60 to an invalid binary value indicative of a timing error, prior to propagation of the binary value to at least one observable hardware device in a third clock cycle.

At step 88, the hardware simulation tool 36 propagates the invalid binary value associated with the output of the register 60 to the at least one observable hardware device.

At step 90, the hardware simulation tool 36 stores the test case utilized to generate the first binary value in a file when the observable hardware device outputs an invalid output value based on the invalid binary value. After step 90, the method is exited.

The method for generating a timing path software monitor for identifying a critical timing path in hardware devices coupled between a pair of components provides a substantial advantage over other methods. In particular, the method automatically generates the timing path software monitor from a static timing report associated with the hardware devices. As a result, a substantial time savings in identifying critical paths in electronic circuitry is obtained.

While the invention is described with reference to an exemplary embodiment, it will be understood by those skilled in the art that various changes may be made and equivalence may be substituted for elements thereof without departing from the scope of the invention. In addition, many modifications may be made to the teachings of the invention to adapt to a particular situation without departing from the scope thereof. Therefore, it is intended that the invention not be limited to the embodiment disclosed for carrying out this invention, but that the invention includes all embodiments falling within the scope of the intended claims. Moreover, the use of the term's first, second, etc. does not denote any order of importance, but rather the term's first, second, etc. are us are used to distinguish one element from another.

We claim:

1. A method for generating a timing path software monitor for identifying a critical timing path in hardware devices coupled between first and second registers, comprising:

generating a static timing report associated with the hardware devices coupled between the first and second registers, utilizing a timing software tool, the static timing report having names of the hardware devices and wire names associated with wires coupled to the hardware devices;

automatically generating the timing path software monitor based on the static timing report, utilizing a timing path software generation tool, the timing path software monitor being a function that monitors binary values associated with the wire names at a first clock cycle and a transition of binary values associated with the wire names during a second clock cycle after the first clock cycle, the timing path software monitor indicating a critical timing path is identified when the transition of one of the binary values received by the second register occurs during the second clock cycle;

inputting a first binary value into the first register during the first clock cycle, provided by a test case, utilizing a hardware simulation tool;

determining that predetermined conditions associated with the hardware devices for the first clock cycle and the second clock cycle are satisfied, utilizing the timing path software monitor;

setting a binary value at an output of the second register to an invalid binary value indicative of a timing error, utilizing the hardware simulation tool, prior to propagation of the binary value to a first device in a third clock cycle;

propagating the invalid binary value associated with the output of the second register to the first device, utilizing the hardware simulation tool; and storing the test case utilized to generate the first binary value in a file when the first device outputs an invalid output value based on the invalid binary value, utilizing the hardware simulation tool.

* * * * *